(12) United States Patent
Fukui

(10) Patent No.: US 7,580,121 B2
(45) Date of Patent: Aug. 25, 2009

(54) FOCAL POINT DETECTION APPARATUS

(75) Inventor: Tatsuo Fukui, Tokyo (JP)

(73) Assignee: Nikon Corporation, Tokyo (JP)

( * ) Notice: Subject to any disclaimer, the term of this patent is extended or adjusted under 35 U.S.C. 154(b) by 227 days.

(21) Appl. No.: 11/661,399

(22) PCT Filed: Oct. 17, 2005

(86) PCT No.: PCT/JP2005/019059

§ 371 (c)(1), (2), (4) Date: Feb. 28, 2007

(87) PCT Pub. No.: WO2006/046430

PCT Pub. Date: May 4, 2006

(65) Prior Publication Data

US 2007/0258084 A1    Nov. 8, 2007

(30) Foreign Application Priority Data

Oct. 29, 2004    (JP)    ............... 2004-315330

(51) Int. Cl.
*G01J 1/00*    (2006.01)
(52) U.S. Cl. .................................................. 356/123
(58) Field of Classification Search ................ 356/123, 356/399–401, 614, 124, 125
See application file for complete search history.

(56) References Cited

U.S. PATENT DOCUMENTS

| | | | | |
|---|---|---|---|---|
| 5,548,401 A | * | 8/1996 | Ozaki | 356/239.3 |
| 5,552,892 A | * | 9/1996 | Nagayama | 356/401 |
| 5,680,200 A | * | 10/1997 | Sugaya et al. | 355/53 |
| 5,754,299 A | * | 5/1998 | Sugaya et al. | 356/401 |
| 6,885,450 B2 | * | 4/2005 | Fukui | 356/401 |
| 7,197,176 B2 | * | 3/2007 | Fukui et al. | 382/141 |
| 2002/0060793 A1 | * | 5/2002 | Fukui | 356/400 |

FOREIGN PATENT DOCUMENTS

| | | |
|---|---|---|
| JP | 09-080301 A | 3/1997 |
| JP | 10-223517 A | 8/1998 |
| JP | 2002-164266 A | 6/2002 |
| JP | 2003-35511 A | 2/2003 |

* cited by examiner

*Primary Examiner*—Tarifur R. Chowdhury
*Assistant Examiner*—Isiaka O Akanbi
(74) *Attorney, Agent, or Firm*—Arent Fox LLP

(57) ABSTRACT

A focal point detection apparatus enlarges a pull-in range of an auto-focus operation easily. The apparatus includes: illumination part illuminating an object plane via first visual field stop; first image-forming part forming an intermediate image of the first visual field stop on second visual field stop based on light from object plane, and transmitting intermediate image without blocking it with second visual field stop when object plane within a specified range contains a focused focal plane, and blocking a portion of intermediate image using second visual field stop when object plane is outside specified range, with remaining portion transmitted; second image-forming part dividing into two the final image of first visual field stop based on light from first image-forming part; and generating part detecting a gap between the divided final images and generating a focusing signal responsive to a locational relationship of object plane to focused focal plane.

2 Claims, 7 Drawing Sheets

(a)

(b)

(c)

(a)

(b)

FOCAL POINT DETECTION APPARATUS

CROSS-REFERENCE TO RELATED APPLICATION

This application is a U.S. National Stage application claiming the benefit of prior filed International Application Number PCT/JP2005/019059, filed Oct. 17, 2005, in which the International Application claims a priority date of Oct. 29, 2004, based on prior filed Japanese Application Number 2004-315330, the entire contents of which are incorporated herein by reference.

TECHNICAL FIELD

The present invention relates to a focal point detection apparatus performing focal point detection of an object plane, and in particular, to a focal point detection apparatus suitable for focus adjustment when positions of marks formed on a substrate (semiconductor wafer, liquid crystal substrate, and so on) are detected with high accuracy in manufacturing processes of a semiconductor element, a liquid crystal display element, and so on.

BACKGROUND ART

In manufacturing processes of a semiconductor element, a liquid crystal display element, and so on, a circuit pattern is transferred to a resist layer via a well-known lithography process, and the circuit pattern is transferred to a specified material film (pattern forming process) by performing manufacturing processes such as an etching via this resist pattern. This pattern forming process is repeatedly performed for several times, and thereby, various circuit patterns of the material film are stacked on a substrate (semiconductor wafer and liquid crystal substrate), and circuits of the semiconductor element and liquid crystal display element are formed.

Further, in the above-stated manufacturing processes, an alignment of the substrate is performed before the lithography process, and an overlay inspection of the resist patterns on the substrate is performed both after the lithography process and before the manufacturing processes within respective pattern forming processes, to overlay various circuit patterns of the material film with high accuracy (to improve production yield). Incidentally, an alignment mark formed on a foundation layer in a last pattern forming process is used for the alignment of the substrate. An overlay mark formed on the resist layer in a current pattern forming process and an overlay mark formed on the foundation layer in the last pattern forming process are used for the overlay inspection of the resist patterns.

Besides, an apparatus detecting positions of the above-stated alignment mark and overlay mark (referred to just as a "mark" in general) is incorporated in an apparatus performing the alignment of the substrate, and an apparatus performing the overlay inspection of the resist patterns on the substrate. In the position detection apparatus, a mark being an object of detection is positioned within a visual field area, a focus adjustment is performed automatically, and thereafter, an image of the mark is scanned by an image pickup device such as a CCD camera, and a specified image processing is performed to the image of the mark, to thereby perform the position detection of the mark.

Further, an apparatus performing a focal point detection of an object plane at a time of focus adjustment is also incorporated in the above-stated position detection apparatus. The focal point detection of the object plane corresponds to a generation of a focusing signal responsive to a locational relationship of the object plane to a focal plane of an image-forming part (namely, a focused focal plane). The focusing signal is used as a control signal to match the object plane to the focused focal plane, and it is outputted to a part adjusting a relative position between the object plane and the focused focal plane (for example, a control device of a stage supporting a substrate).

As a conventional focal point detection apparatus, for example, a pupil dividing method is proposed (for example, refer to Patent document 1). In this apparatus, an object plane is illuminated via a visual field stop, images of the visual field stop are formed while dividing into two parts based on light from the object plane, and a focusing signal is generated by detecting a gap between the two images. For example, the nearer the object plane comes to an image-forming part, the larger the gap between the two images becomes, and the farther the object plane separates from the image-forming part, the smaller the gap becomes. The gap between the two images increases/decreases linearly in proportion to the locational relationship of the object plane to the focused focal plane. Besides, the gap when the object plane matches to the focused focal plane is well-known. The focusing signal is therefore generated in accordance with a difference between the gap between the two images and the well-known gap.

Patent document 1: Japanese Unexamined Patent Application Publication No. Hei 10-223517

DISCLOSURE OF THE INVENTION

Problems to be Solved by the Invention

However, in the above-stated focal point detection apparatus, the gap between the two images increases/decreases linearly in proportion to the locational relationship of the object plane to the focused focal plane, and therefore, inside portions of the two images may overlay with each other, or outside portions of the two images may be out of a light-receiving area of a sensor, if a defocus amount of the object plane (a positional displacement amount from the focused focal plane) becomes large. Accordingly, the generation of the focusing signal becomes difficult because the gap between the two images cannot be detected.

If the focusing signal cannot be generated in the focal point detection apparatus, an auto-focus operation matching the object plane to the focused focal plane does not function normally, and subsequent processes (for example, the above-stated position detection of the mark) cannot be performed well. A range allowable as the defocus amount of the object plane, namely, the range in which the auto-focus operation functions normally corresponds to the range in which the focusing signal can be generated at the focal point detection apparatus, and the range is called as a "pull-in range of the auto-focus operation" in the following description.

In the above-stated focal point detection apparatus, the pull-in range of the auto-focus operation is from a position of the object plane where the inside portions of the two images are overlaying with each other to a position of the object plane where the outside portions of the two images are out of the light-receiving area of the sensor. In order to enlarge the above-stated pull-in range, it is necessary to enlarge the sensor and an optical system so that the inside portions of the two images do not overlay, and the outside portions of the two images do not out of the sensor even when the defocus amount of the object plane becomes large, and it leads to a cost increase.

An object of the present invention is to provide a focal point detection apparatus capable of easily enlarging the pull-in range of the auto-focus operation.

Means for Solving the Problems

A focal point detection apparatus of the present invention, includes: an illumination part, having a first visual field stop, that illuminates an object plane via the first visual field stop; a first image-forming part, having a second visual field stop, that forms an intermediate image of the first visual field stop on a positioning plane of the second visual field stop based on light emitted from the object plane, and transmits the intermediate image without blocking it with the second visual field stop when the object plane is situated within a specified range containing a focused focal plane, and blocks a portion of the intermediate image using the second visual field stop when the object plane is situated outside the specified range, with the remaining portion being transmitted; a second image-forming part that divides into two parts and forms a final image of the first visual field stop based on light from the first image-forming part; and a generating part that detects a gap between the final images of the first visual field stop that were divided into two and generates a focusing signal responsive to a locational relationship of the object plane to the focused focal plane.

Besides, in the above-stated focal point detection apparatus, the second visual field stop is conjugate with the first visual field stop and satisfies the following equation with respect to an equivalent direction to the divided-into-two direction on the positioning plane: $A_1 < A_2 < (1+NA) \times A_1$, in which $A_1$: one-dimensional length of the intermediate image of the first visual field stop when the object plane matches the focused focal plane, $A_2$: one-dimensional length of the second visual field stop, and NA: Numerical aperture of the object plane side of the image-forming part.

Effect of the Invention

According to a focal point detection apparatus of the present invention, it is possible to easily enlarge the pull-in range of the auto-focus operation.

BRIEF DESCRIPTION OF THE DRAWINGS

The nature, principle, and utility of the invention will become more apparent from the following detailed description when read in conjunction with the accompanying drawings in which like parts are designated by identical reference numbers, in which.

BEST MODE FOR CARRYING OUT THE INVENTION

Hereinafter, embodiments of the present invention are described in detail with reference to the drawings.

Figure 1:
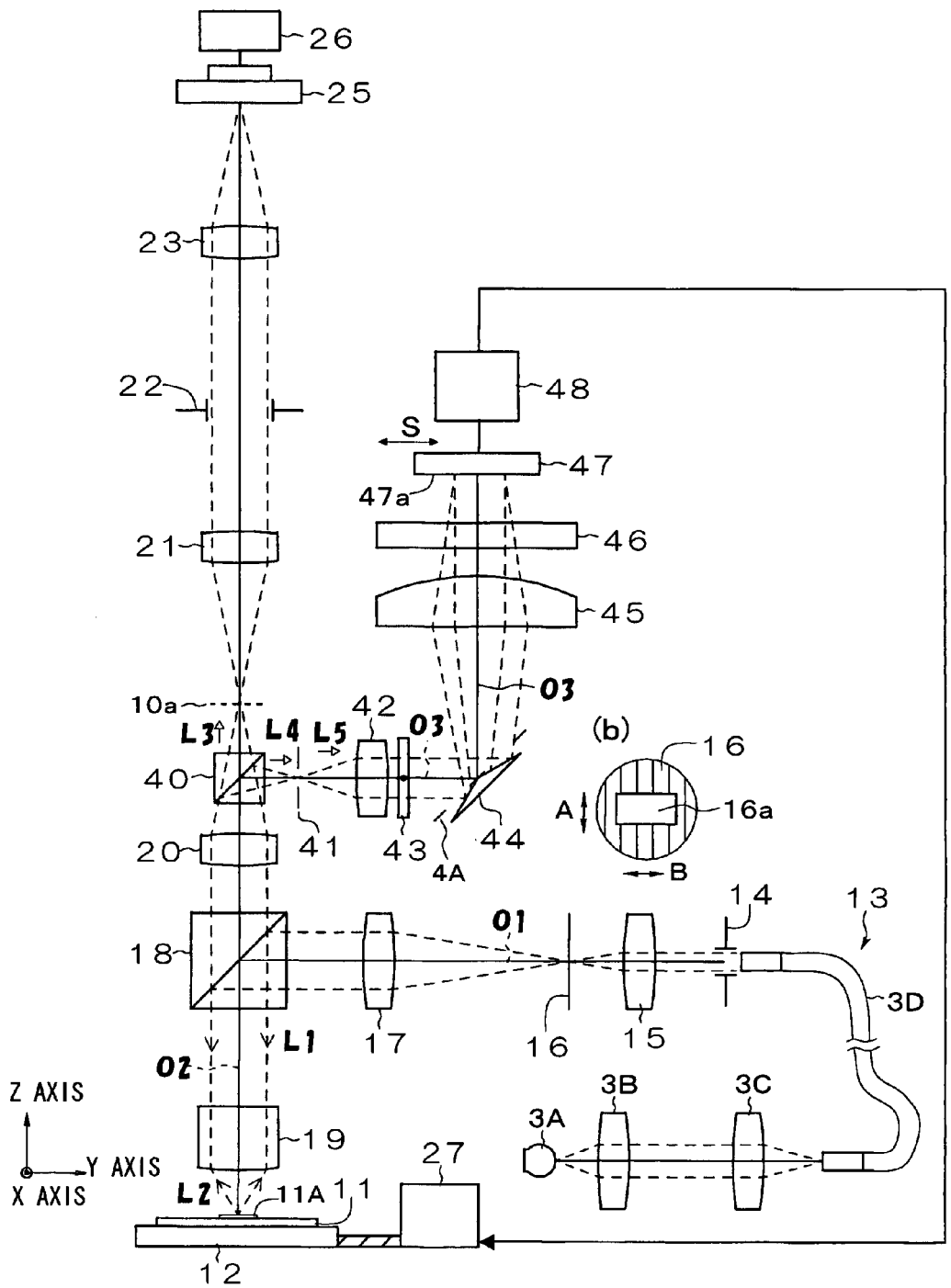
[FIG. 1] are views showing a constitution of a focal point detection apparatus of the present embodiment incorporated in an overlay measurement apparatus 10.

Here, a focal point detection apparatus of the present embodiment is described while taking an overlay measurement apparatus 10 shown in FIG. 1 for instance. The overlay measurement apparatus 10 is an apparatus performing an overlay inspection of a resist pattern (not shown) of a substrate 11 in manufacturing processes of a semiconductor element, a liquid crystal display element, and so on. In the overlay inspection, a measurement of a positional displacement amount of the resist pattern relative to a circuit pattern formed on a foundation layer of the substrate 11 (hereinafter, referred to as an "underlying pattern") is performed.

As shown in FIG. 1(a), a stage 12 supporting the substrate 11, an illumination optical system (13 to 19), an imaging optical system (19 to 23), a CCD image pickup device 25, an image processing unit 26, a focal point detection unit (40 to 48), and a stage control unit 27 are provided in the overlay measurement apparatus 10. Among the above, the illumination optical system (13 to 19), a part of optical elements (19, 20) of the imaging optical system (19 to 23), and the focal point detection unit (40 to 48) function as the focal point detection apparatus of the present embodiment.

The stage 12 is constituted by a holder holding and supporting the substrate 11 in a horizontal state, an XY driving unit driving the holder in a horizontal direction (XY direction), and a Z driving unit driving the holder in a vertical direction (Z direction), though they are not shown. The XY driving unit and the Z driving unit are connected to the stage control unit 27.

Here, the substrate 11 is a semiconductor wafer, a liquid crystal substrate, or the like, and it is in a state after an exposure, development for a resist layer and before a process for a specified material film. A number of measurement points are prepared on the substrate 11 for an overlay inspection. Positions of the measurement points are at four corners and so on of respective shot areas. A resist mark showing a reference position of a resist pattern and an underlying mark showing a reference position of an underlying pattern are formed at each measurement point. In the following description, the resist mark and underlying mark are generally referred to as an "overlay mark 11A".

The stage control unit 27 controls the XY driving unit of the stage 12, moves the holder in the XY direction, and makes a positioning of the overlay marks 11A on the substrate 11 within a visual field area, under a state in which the above-stated substrate 11 is supported by the holder of the stage 12. Besides, the stage control unit 27 controls the Z driving unit of the stage 12 to vertically move the holder in the Z direction, based on a later-described focusing signal outputted from the focal point detection unit (40 to 48). It becomes possible to focus a surface of the substrate 11 (object plane) relative to an image pickup plane of the CCD image pickup device 25 by the focus adjustment as stated above.

The illumination optical system (13 to 19) is constituted by a light source unit 13; an illumination aperture stop 14, a condenser lens 15 that condenses light from the illumination optical system (13 to 19), an illumination visual field stop 16 of which an aperture is formed within a range including an optical axis O1 of the condenser lens, an illumination relay leans 17, a beam splitter 18 disposed sequentially along the optical axis O1; and a first objective lens 19 disposed on an optical axis O2. The beam splitter 18 is disposed also on the optical axis O2, while a reflection transmission plane thereof is inclined approximately 45 relative tot eh optical axis O1. The optical axis O1 of the illumination optical system (13 to 19) is perpendicular to the optical axis O2 of the imaging optical system (19 to 23). The illumination optical system (13 to 19) illuminates an object plane via the illumination visual field stop 16.

Besides, the light source unit 13 is constituted by a light source 3A, a collector lens 3B, a light source relay lens 3C, and a light guide fiber 3D. The light source 3A emits light with a wide wavelength band (for example, white light). In the above-stated light source unit 13, the wide-band wavelength light emitted from the light source 3A is guided to the illumination aperture stop 14 via the collector lens 3B, the light source relay lens 3C, and the light guide fiber 3D.

A center of the illumination aperture stop 14 is situated on the optical axis O1, and limits a diameter of the wide-band wavelength light emitted from the light source unit 13 into a specific diameter. The condenser lens 15 condenses the light from the illumination aperture stop 14. The illumination visual field stop 16 is an optical element limiting a visual field area of the overlaying measurement apparatus 10, and has a slit 16a which is a rectangular opening as shown in FIG. 1(b). The illumination relay lens 17 collimates the light from the slit 16a of the illumination visual field stop 16. The beam splitter 18 reflects the light from the illumination relay lens 17 downward.

In the above-stated constitution, the wide-band wavelength light emitted from the light source unit 13 uniformly illuminates the illumination visual field stop 16 via the illumination aperture stop 14 and the condenser lens 15. The light passing through the slit 16a of the illumination visual field stop 16 is guided to the beam splitter 18 via the illumination relay lens 17, and guided to the first objective lens 19 on the optical axis O2 after being reflected at the reflection transmission plane of the beam splitter 18 (illumination L1).

The illumination L1 from the beam splitter 18 is incident on the first objective lens 19 to be condensed. Accordingly, the substrate 11 on the stage 12 is illuminated perpendicularly by the wide-band wavelength illumination L1 transmitted through the first objective lens 19 (epi-illumination). The above-stated illumination optical system (13 to 19) functions as a part illuminating a surface of the substrate 11 (object plane) via the illumination visual field stop 16 (an "illumination part" in the claims). The illumination visual field stop 16 corresponds to a "first visual field stop" in the claims.

Incidentally, an angle of the illumination L1 incident on the substrate 11 is determined by a locational relationship between the center of the illumination aperture stop 14 and the optical axis O1. Besides, an incident angle range of the illumination L1 at each point of the substrate 11 is determined by an aperture diameter of the illumination aperture stop 14. It is because the illumination aperture stop 14 is in a conjugate locational relationship with a pupil of the first objective lens 19.

Further, the illumination visual field stop 16 and the surface of the substrate 11 (object plane) in a focus state are in the conjugate locational relationship, and therefore, an area corresponding to the slit 16a of the illumination visual field stop 16 among the surface of the substrate 11 (object plane) is illuminated by the illumination L1. Namely, an image of the slit 16a is projected to the surface of the substrate 11 (object plane) by functions of the illumination relay lens 17 and the first objective lens 19.

On the surface of the substrate 11 (object plane), the image of the slit 16a is formed such that a longitudinal direction (an equivalent direction to a B direction in FIG. 1(b)) and a short side direction thereof (an equivalent direction to an A direction in FIG. 1(b)) make an angle of 45 degrees with a street pattern existing on the object plane. In an actual process, the substrate 11 is carried to the stage 12 such that the street pattern of the substrate 11 makes the angle of 45 degrees relative to the longitudinal direction and the short side direction of the image of the slit 16a. An error influenced by the pattern at the time of the auto-focus operation can be reduced by keeping the angle relationship as stated above.

Besides, the overlay mark 11A on the substrate 11 is positioned in a vicinity of a center of the area where the image of the slit 16a is projected (illumination area).

Reflected light L2 is emitted from the area of the substrate 11 where the above-stated wide-band wavelength illumination L1 is irradiated. The reflected light L2 from the substrate 11 is guided to the imaging optical system (19 to 23).

The imaging optical system (19 to 23) is constituted by the first objective lens 19, a second objective lens 20, a first imaging relay lens 21, an imaging aperture stop 22, and a second imaging relay lens 23 disposed sequentially along the optical axis O2. The optical axis O2 of the imaging optical system (19 to 23) is in parallel with the Z direction. Incidentally, the beam splitter 18 of the illumination optical system (13 to 19) is disposed between the first objective lens 19 and the second objective lens 20, and a beam splitter 40 of the focal point detection unit (40 to 48) is disposed between the second objective lens 20 and the first imaging relay lens 21. The beam splitters 18, 40 are half prisms performing an amplitude splitting of light.

The first objective lens 19 collimates the reflected light L2 from the substrate 11. The reflected light L2 collimated by the first objective lens 19 is incident on the second objective lens 20 transmitting through the above-stated beam splitter 18. The second objective lens 20 condenses the reflected light L2 from the beam splitter 18 on a primary image-forming plane 10a.

A reflection transmission plane of the beam splitter 40 of the focal point detection unit (40 to 48) disposed at a front stage of the primary image-forming plane 10a is inclined approximately 45° relative to an optical axis O3 of the focal point detection unit (40 to 48) and the optical axis O2 of the imaging optical system (19 to 23). The beam splitter 40 transmits a portion (L3) of the reflected light L2 from the second objective lens 20 and reflects a portion of the remainder (L4). The portion of light (L3) transmitted through the beam splitter 40 is guided to the first imaging relay lens 21 of the imaging optical system (19 to 23) after passing through the primary image-forming plane 10a. The first imaging relay lens 21 collimates the light L3 from the beam splitter 40.

The imaging aperture stop 22 is disposed on a conjugate plane with the pupil of the first objective lens 19, and limits a diameter of the light from the first imaging relay lens 21 into a specific diameter. The second imaging relay lens 23 reimages the light from the imaging aperture stop 22 on the image pickup plane of the CCD image pickup device 25 (secondary image-forming plane).

In the above-stated imaging optical system (19 to 23), an image of a mark (the image based on the reflected light L2 from the substrate 11 (reflected image)) is formed on the image pickup plane of the CCD image pickup device 25, when the overlay mark 11A on the substrate 11 is positioned within the visual field area.

The CCD image pickup device 25 is an area sensor in which plural pixels are two-dimensionally aligned, and it is disposed such that the image pickup plane thereof matches an image plane of the imaging optical system (19 to 23). The CCD image pickup device 25 captures images of the overlay mark 11A on the substrate 11, and outputs an image signal to the image processing unit 26. The image signal represents distribution relating to a brightness value (brightness distribution) by each pixel on the image pickup plane of the CCD image pickup device 25.

The image processing unit 26 scans the image of the overlay mark 11A on the substrate 11 based on the image signal from the CCD image pickup device 25, and performs an image process for the overlay inspection to the image. Then, the overlay inspection of the substrate 11 (an inspection of an overlay state of a resist pattern relative to a foundation pattern) is performed. In the overlay inspection, position detections of the resist mark and the foundation mark of the overlay mark 11A, and a measurement of an overlay amount of the overlay mark 11A are performed. Incidentally, observation by a not-shown television monitor is also possible via the image processing unit 26.

Next, a description of the focal point detection unit (40 to 48) is performed.

The focal point detection unit (40 to 48) is disposed between the second objective lens 20 and the primary image-forming plane 10a of the imaging optical system (19 to 23), and constituted by an optical system composed of the beam splitter 40, an AF visual field stop 41, an AF first relay lens 42, a plane-parallel plate 43, a pupil dividing mirror 44, an AF second relay lens 45, and a cylindrical lens 46 disposed sequentially along the optical axis O3; an AF sensor 47; and a signal processing unit 48.

A portion of the light L4 reflected by the beam splitter 40 (hereinafter, referred to as "AF light L4") is guided to the focal point detection unit (40 to 48). The AF light L4 is a portion of the light (reflected light L2) emitted from the object plane. This focal point detection unit (40 to 48) functions as the focal point detection apparatus of the present embodiment together with the above-stated illumination optical system (13 to 19) and a portion of the optical elements (19, 20) of the imaging optical system (19 to 23). The focal point detection apparatus of the present embodiment detects whether the surface of the substrate 11 (object plane) is in the focus state to the image pickup plane of the CCD image pickup device 25 or not. Namely, it is to perform the focal point detection of the object plane.

In the focal point detection unit (40 to 48), the AF light L4 from the beam splitter 40 is at first incident on the AF visual field stop 41. The AF visual field stop 41 is conjugate with the surface of the substrate 11 (object plane) in the focus state, and conjugate with the illumination visual field stop 16. An intermediate image 16b of the illumination visual field stop 16 (refer to FIG. 2) is formed on a positioning plane of the AF visual field stop 41 owing to a light condensing effect of the first objective lens 19 and the second objective lens 20. The AF visual field stop 41, the first objective lens 19, and the second objective lens 20 are generally correspond to a "first image-forming part" in the claims. The AF visual field stop 41 corresponds to a "second visual field stop" in the claims.

A center of the intermediate image 16b of the illumination visual field stop 16 is constantly on the optical axis O3, and it does not move if a locational relationship of the surface of the substrate 11 (object plane) to a focal plane (namely, a focused focal plane) of the imaging optical system (19 to 23) changes. A blur state of an outline of the intermediate image 16b of the illumination visual field stop 16 changes when the locational relationship of the object plane to the focused focal plane changes.

FIG. 2(a) is a view in which the intermediate image 16b is seen from the direction of the optical axis O3 when the object plane matches the focused focal plane (in the focus state). FIG. 2(b) shows an intensity profile of the intermediate image 16b in the focus state, and it can be seen that the outline of the intermediate image 16b is not blurred (becomes sharp) in this case. FIG. 2(c) shows the intensity profile of the intermediate image 16b when the object plane is outside the focused focal plane (in a defocus state), and it can be seen that the outline of the intermediate image 16b is blurred in this case.

A size A2 of the AF visual field stop 41 is set so as to satisfy the following equation (1) relative to the above-stated intermediate image 16b of the illumination visual field stop 16. The size $A_2$ is one-dimensional length with respect to a measurement direction (x direction) of the AF visual field stop 41. Besides, a size $A_1$ of the equation (1) is one-dimensional length with respect to a measurement direction of the intermediate image 16b in the focus state. Numerical aperture NA is the numerical aperture at the object plane side of the imaging optical system (19 to 23).

$$A_1 < A_2 < (1+NA) \times A_1 \qquad (1)$$

The size of $A_2$ of the AF visual field stop 41 satisfying the equation (1) may be larger than the size $A_1$ of the intermediate image 16b in the focus state, and the size to be (1+NA) times of the size $A_1$ of the intermediate image 16b in the focus state or less with respect to the measurement direction (x direction). It is known from a simulation that a portion of a defocused intermediate image overlays with an edge of the AF visual field stop 41 and it can be detected by an edge image of the AF visual field stop 41 even when the size $A_2$ of the AF visual field stop 41 is set to be approximately $(1+NA) \times A_1$. In the present embodiment, the numerical aperture NA at the object plane side of the imaging optical system (19 to 23) is set to be 0.75, and the size $A_2$ of the AF visual field stop 41 is set to be $1.3 \times A_1$. Incidentally, 1.3 times of a size $A_3$ of the intermediate image 16b in the focus state is set as a size $A_4$ of the AF visual field stop 41 with respect to a non-measurement direction (y direction).

Consequently, the blur (widening) of the outline of the intermediate image 16b becomes small when the object plane is situated within a specified range containing the focused focal plane, and it becomes possible to transmit the intermediate image 16b without blocking it with the AF visual field stop 41. On the contrary, when the object plane is situated outside the specified range, the blur of the outline of the intermediate image 16b becomes large, and it becomes possible to block a portion of the intermediate image 16b by the AF visual field stop 41 (namely, the outline portion), while the remaining portion is transmitted.

AF light L5 passing through the AF visual field stop 41 (FIG. 1) is collimated by the AF first relay lens 42, transmits the plane-parallel plate 43, and is incident on the pupil dividing mirror 44. An image of the illumination aperture stop 14 is formed on the pupil dividing mirror 44. A blocking stop 4A blocking a center portion of the AF light L5 and transmitting peripheral portion is attached to the pupil dividing mirror 44, and stray light such as a ghost image is removed. The plane-parallel plate 43 is an optical element to make a position adjustment of the image of the illumination aperture stop 14 to the center of the pupil dividing mirror 44, and it has a mechanism capable of tilt adjustment.

Figure 3:
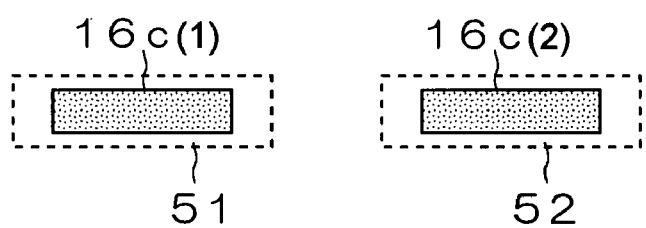
[FIG. 3] are views explaining final images 16c(1), (2) of the illumination visual field stop 16 and positions of the AF visual field stop 41 (dotted line frames 51, 52) on an image pickup plane 47a of an AF sensor 47.
Figure 3:
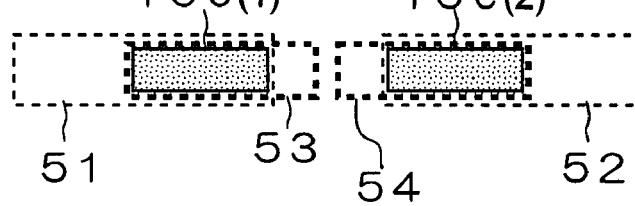
Figure 3:
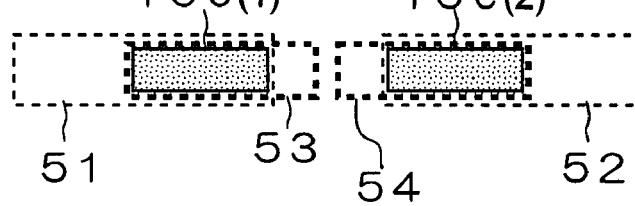

The AF light L5 incident on the pupil dividing mirror 44 is amplitude split into two direction light (namely, divided into two parts), and thereafter, condensed in a vicinity of the image pickup plane 47a of the AF sensor 47 via the AF second relay lens 45 and the cylindrical lens 46. At this time, final images 16c(1), (2) of the illumination visual field stop 16 as shown in FIG. 3(a) are formed at separate positions along a measurement direction (S direction) on the image pickup plane 47a of the AF sensor 47. The final images 16c(1), (2) are in shapes compressed by a refractive power of the cylindrical lens 46 in a non-measurement direction (perpendicular direction to the S direction).

The above-stated AF first relay lens 42, the pupil dividing mirror 44, the AF second relay lens 45, and the cylindrical lens 46 function as a part forming the final images 16c(1), (2) of the illumination visual field stop 16 while dividing into two parts based on the AF light L5 from the AF visual field stop 41 (a "second image-forming part" in the claims).

Figure 2:
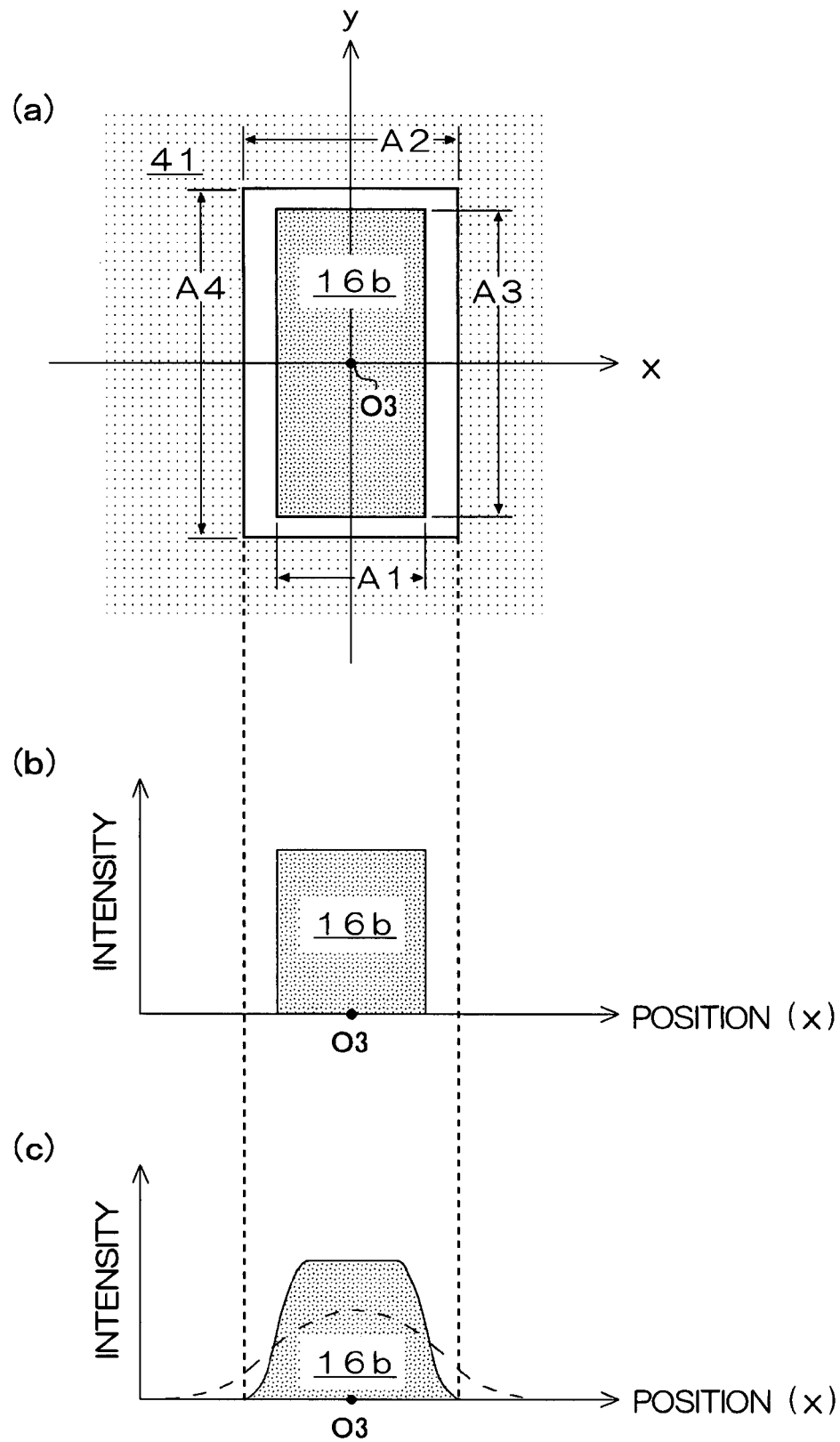
[FIG. 2] are views explaining shapes of an intermediate image 16b of an illumination visual field stop 16 and an AF visual field stop 41.

Here, the measurement direction (S direction) on the image pickup plane 47a of the AF sensor 47 is equivalent to the direction of division into two parts by the above-stated pupil dividing mirror 44 (FIG. 1), and it is equivalent to the measurement direction (x direction) on the positioning plane of the AF visual field stop 41 (FIG. 2). Besides, the non-measurement direction (perpendicular direction to the S direction) on the image pickup plane 47a of the AF sensor 47 is equivalent to the non-measurement direction (y direction) on the positioning plane of the AF visual field stop 41.

Dotted line frames 51, 52 shown in FIG. 3(a) represent positions of the AF visual field stop 41 projected to the image pickup plane 47a of the AF sensor 47. The image pickup plane 47a and the AF visual field stop 41 are conjugate, and therefore, the positions of the AF visual field stop 41 (dotted line frames 51, 52) projected to the image pickup plane 47a do not move even if the locational relationship of the object plane to the focused focal plane is changed. On the contrary, in the final images 16c(1), (2) of the illumination visual field stop 16, the gap between the final images 16c(1), (2) changes, and the blur state of the outlines of the final images 16c(1), (2) also change, when the locational relationship of the object plane to the focused focal plane changes.

Figure 4:
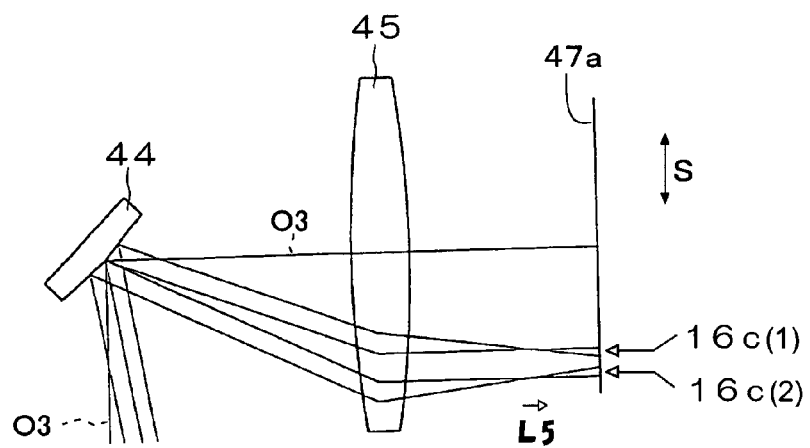
[FIG. 4] are views explaining changes of a gap between the final images 16c(1), (2) of the illumination visual field stop 16 and a blur state of an outline.
Figure 4:
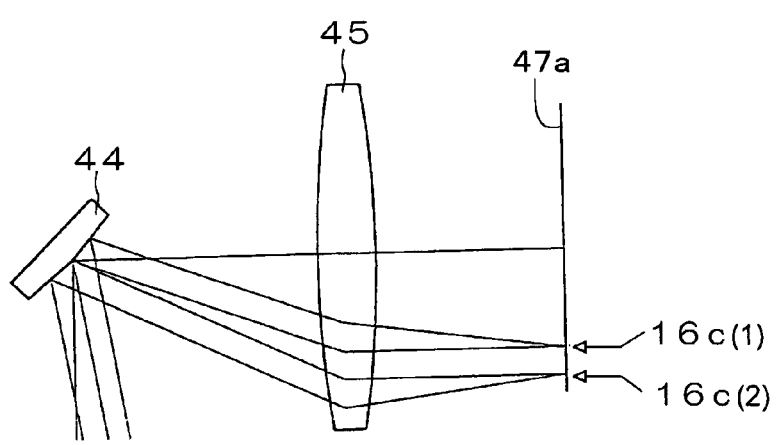
Figure 4:
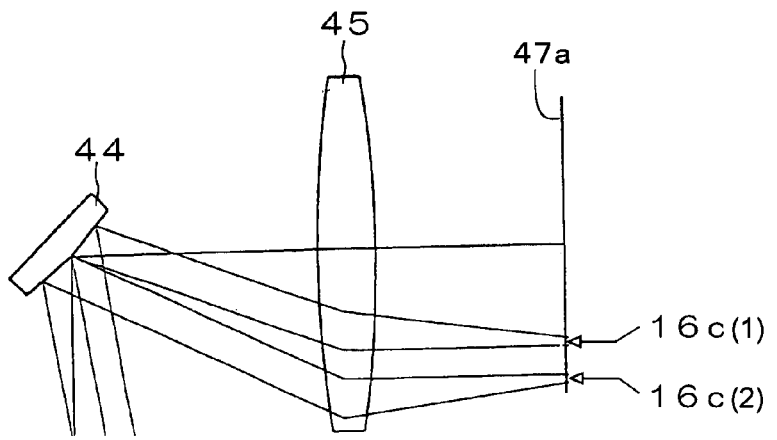

The change of the final images 16c(1), (2) as stated above is described by using schematic views of FIGS. 4(a), 4(b), 4(c). FIGS. 4(a), 4(b), 4(c) are respectively showing appearances of a front focus state in which the object plane is defocused toward a lower side (− side) from the focused focal plane, a focus state in which the object plane matches the focused focal plane, and a rear focus state in which the object plane is defocused toward an upper side (+ side) from the focused focal plane.

As it can be seen from FIGS. 4(a), 4(b), 4(c), the final images 16c(1), (2) approach with each other in the front focus state (a), and separate from each other in the rear focus state (c). Namely, when the stage 12 is moved upward/downward in the Z direction to change the locational relationship between the object plane and the focused focal plane, the final images 16c(1), (2) approach/separate along the measurement direction (S direction) of the image pickup plane 47a of the AF sensor 47. In other words, the gap between the final images 16c(1), (2) changes. Further, a convergent position of the AF light L5 moves along the direction of the optical axis O3, and therefore, the blur states of the outlines of the final images 16c(1), (2) also change.

However, it is conceivable that luminous flux is not approximately incident on an outside of the projection positions of the AF visual field stop 41 (dotted line frames 51, 52) shown in FIG. 3(a) on the image pickup plane 47a of the AF sensor 47, as same as the AF visual field stop 41 blocks the luminous flux outside the aperture.

Accordingly, when the gap between the final images 16c(1), (2) becomes large in the rear focus state as shown in FIG. 4(c), the portions which are out of the dotted line frames 51, 52 in FIG. 3(b) are blocked, and the final images 16c(1), (2) are formed by the remaining portions. Heavy dotted line frames 53, 54 in FIG. 3(b) represent the outlines of the final images 16c(1), (2) when the AF visual field stop 41 is omitted. Overlaying portions of this dotted line frames 53, 54 and the projection positions of the AF visual field stop 41 (dotted line frames 51, 52) are to be actual final images 16c(1), (2). In FIG. 3(b), the blur states of the outlines of the final images 16c(1), (2) are not shown.

Similarly, when the gap between the final images 16c(1), (2) becomes small in the front focus state as shown in FIG. 4(a), the portions which are out of the dotted line frames 51, 52 in FIG. 3(c) are blocked, and the final images 16c(1), (2) are formed by the remaining portions. Also in this case, the heavy dotted line frames 53, 54 in FIG. 3(c) represent the outlines of the final images 16c(1), (2) when the AF visual field stop 41 is omitted. The overlaying portions of the heavy dotted line frames 53,54 and the projection positions of the AF visual field stop 41 (dotted line frames 51, 52) are to be the actual final images 16c(1), (2). Also in FIG. 3(c), the blur states of the outlines are not shown.

A line sensor is used for the AF sensor 47 (FIG. 1) to capture the final images 16c(1), (2) as shown in FIGS. 3(a) to 3(c). Plural pixels are one-dimensionally aligned on the image pickup plane 47a of the AF sensor 47. An alignment direction of the pixels at the image pickup plane 47a is in parallel with the measurement direction (S direction). A size in the measurement direction (S direction) of the image pickup plane 47a is the size in which the projection positions of the AF visual field stop 41 (dotted line frames 51, 52) are contained. The AF sensor 47 outputs an image pickup signal with respect to the intensity profiles of the final images 16c(1), (2) to the signal processing unit 48 at a rear stage, when the final images 16c(1), (2) on the image pickup plane 47a are captured.

When the object plane matches the focused focal plane (focus state), the final images 16c(1), (2) on the image pickup plane 47a of the AF sensor 47 are formed at the positions as shown in FIG. 5(a) without blurring the outlines thereof, and the intensity profiles of the final images 16c(1), (2) become as shown in FIG. 5(b). In FIG. 5(b), edge positions corresponding to the projection positions of the AF visual field stop 41 (dotted line frames 51, 52) are shown by S1 to S4. Between the edge positions S1, S2 corresponds to inside of the dotted line frame 51, and between the edge positions S3, S4 corresponds to inside of the dotted line frame 52.

Besides, when the object plane is situated within a specified range containing the focused focal plane (near the focus state), some blur of the outlines appears in the final images 16c(1), (2), and the gap between the final images 16c(1), (2) becomes a little larger (or smaller) compared to the above-stated focus state, but the final images 16c(1), (2) are not blocked by the edge positions S1 to S4. Consequently, the final images 16c(1), (2) which are the same sizes with the case when the AF visual field stop 41 is omitted are respectively formed at completely inside between the edge positions S1, S2 and between the edge positions S3, S4. In this case, the edge positions S1 to S4 are not transferred as the images.

The signal processing unit 48 sets a specified slice level (for example, 50%) for the intensity profiles of the final images 16c(1), (2) as shown in FIG. 5(b), obtains positions of four intersection points K1 to K4 at this slice level, and obtains a gap $\Delta L$ between the final images 16c(1), (2). Next, a difference between a gap $\Delta Lo$ in the focus state which is stored in advance (namely, [$\Delta L-\Delta Lo$] or [$\Delta Lo-\Delta L$]) is obtained to generate a focusing signal.

The focusing signal is a signal responsive to the locational relationship of the object plane to the focused focal plane, and it is outputted to the stage control unit 27 as a control signal to match the object plane to the focused focal plane. Incidentally, the AF sensor 47 and the signal processing unit 48 generally function as a part generating the focusing signal responsive to the locational relationship of the object plane to the focused focal plane by detecting the gap between the final images 16c(1), (2) which are divided into two parts (a "generating part" in the claims).

When the object plane is situated within the specified range containing the focused focal plane (namely, when the final images 16c(1), (2) are not blocked by the edge positions S1 to S4), the gap $\Delta L$ between the final images 16c(1), (2) increases/decreases linearly in proportion to a change of the locational relationship of the object plane to the focused focal plane when the locational relationship changes. Consequently, the focusing signal generated from the difference between the gap $\Delta L$ between the final images 16c(1), (2) and the gap $\Delta Lo$ in the focus state becomes a control signal representing an accurate offset (defocus amount) of the object plane.

On the other hand, when the object plane is situated outside the above-stated specified range and in the rear focus state in which the object plane is defocused toward an upper side (+ side) from the focused focal plane (refer to FIG. 4(c)), the final images 16c(1), (2) on the image pickup plane 47a of the AF sensor 47 are formed at positions as shown in FIG. 6(a) in a state in which the outlines are blurred (refer to FIG. 6(b)). The intensity profiles in FIG. 6(b) correspond to heavy dotted line frames 53, 54 in FIG. 6(a) (namely, the case when the AF visual field stop 41 is omitted).

In actual, portions other than oblique line portions among the intensity profiles in FIG. 6(b) are blocked by the edge position S1 and the edge position S4. Accordingly, the actual intensity profiles become the one as shown in FIG. 6(c). In this case, the edge position S1 and the edge position S4 are transferred into the intensity profiles in FIG. 6(c) as images. Projections of the edge positions S1, S4 as stated above results from the edges in the measurement direction (x direction) of the AF visual field stop 41 being illuminated by the blurred intermediate image 16b of the illumination visual field stop 16, in the positioning plane of the AF visual field stop 41 (FIG. 2).

Even in such a case, the signal processing unit 48 sets a specified slice level (for example 50%) for the intensity profile of the final images 16c(1), (2) as shown in FIG. 6(c), obtains positions of four intersection points K1 to K4 in this slice level, and obtains a gap $\Delta L(+)$ of the final images 16c(1), (2). Next, a difference between the gap $\Delta Lo$ in the focus state which is stored in advance (namely, [$\Delta L(+)-\Delta Lo$] or [$\Delta Lo-\Delta L(+)$]) is obtained to generate the focusing signal. This focusing signal is also outputted to the stage control unit 27.

When the object plane is situated outside the above-stated specified range and in the rear focus state in which the object plane is defocused toward the upper side (+ side) from the focused focal plane (namely, when the final images 16c(1), (2) are blocked by the edge positions S1, S4), the gap $\Delta L(+)$ between the final images 16c(1), (2) becomes constantly a larger value than the gap $\Delta Lo$ in the focus state. Besides, this gap $\Delta L(+)$ increases/decreases without in proportion to a change of the locational relationship even if the locational relationship of the object plane to the focused focal plane changes.

Consequently, the focusing signal responsive to the gap $\Delta L(+)$ does not become a signal representing an accurate offset (defocus amount) of the object plane, but it is effective as a control signal to pull back the object plane toward the lower side (− side). Namely, the focusing signal responsive to the gap $\Delta L(+)$ is effective as the control signal representing the defocus direction of the object plane. It becomes possible to drive the object plane in the above-stated specified range, to become a similar state with FIG. 5 by using the focusing signal responsive to the gap $\Delta L(+)$.

Further, the projection positions of the AF visual field stop 41 (edge positions S1 to S4) on the image pickup plane 47a of the AF sensor 47 do not move even if the defocus amount toward the + side becomes large, and therefore, the state in which the final images 16c(1), (2) are blocked by the edge positions S1, S4 (FIG. 6) is the same. Consequently, it is possible to generate the focusing signal responsive to the gap $\Delta L(+)$ similar to the above even when the defocus amount toward the + side becomes large. In addition, it is possible to pull back the object plane toward the lower side (− side) and drive in the above-stated specified range by using this focusing signal.

On the contrary, when the object plane is situated outside the above-stated specified range, and in the front focus state in which the object plane is defocused toward the lower side (− side) than the focused focal plane (refer to FIG. 4(a)), the final images 16c(1), (2) on the image pickup plane 47a of the AF sensor 47 are formed at positions as shown in FIG. 7(a) in a state in which the outlines are blurred (refer to FIG. 7(b)). Intensity profiles in FIG. 7(b) correspond to heavy dotted line frames 53, 54 in FIG. 7(a) (namely, when the AF visual field stop 41 is omitted).

In actual, portions other than oblique line portions among the intensity profiles in FIG. 7(b) are blocked by the edge position S2 and the edge position S3. Accordingly, the actual intensity profiles become the one as shown in FIG. 7(c). In this case, the edge position S2 and the edge position S3 are transferred into the intensity profiles in FIG. 7(c) as images. Projections of the edge positions S2, S3 as stated above results from the edges of the AF visual field stop 41 in the measurement direction (x direction) being illuminated by the blurred intermediate image 16b of the illumination visual field stop 16, in the positioning plane of the AF visual field stop 41 (FIG. 2).

Even in such a case, the signal processing unit 48 sets a specified slice level (for example 50%) for the intensity profiles of the final images 16c(1), (2) as shown in FIG. 7(c), obtains the positions of the four intersection points K1 to K4 at this slice level, and obtains a gap $\Delta L(-)$ of the final images 16c(1), (2). Next, a difference from the gap $\Delta Lo$ in the focus state which is stored in advance (namely, [$\Delta L(-)-\Delta Lo$] or [$\Delta Lo-\Delta L(-)$]) is obtained to generate the focusing signal. This focusing signal is also outputted to the stage control unit 27.

When the object plane is situated outside the above-stated specified range, and in the front focus state in which the object plane is defocused toward the lower side (− side) from the focused focal plane (namely, when the final images 16c(1), (2) are blocked by the edge positions S2, S3), the gap $\Delta L(-)$ between the final images 16c(1), (2) becomes constantly a smaller value than the gap ΔLo in the focus state. Besides, this gap ΔL(−) increases/decreases without in proportion to a change of the locational relationship of the object plane to the focused focal plane even if the locational relationship changes.

Consequently, the focusing signal responsive to the gap ΔL(−) does not become a signal representing the accurate offset (defocus amount) of the object plane, but it is effective as a control signal to pull back the object plane toward the upper side (+ side). Namely, the focusing signal responsive to the gap ΔL(−) is effective as the control signal representing the defocus direction of the object plane. It becomes possible to drive the object plane in the above-stated specified range, to be a similar state with FIG. 5 by using the focusing signal responsive to the gap ΔL(−).

Further, the projection positions of the AF visual field stop 41 (edge positions S1 to S4) on the image pickup plane 47a of the AF sensor 47 do not move even if the defocus amount toward the − side becomes large, and therefore, the state in which the final images 16c(1), (2) are blocked by the edge positions S2, S3 (FIG. 7) is the same. Consequently, it is possible to generate the focusing signal responsive to the gap ΔL(−) similar to the above even when the defocus amount toward the − side becomes large. In addition, it is possible to pull back the object plane toward the upper side (+ side) and drive in the above-stated specified range by using. this focusing signal.

Figure 6:
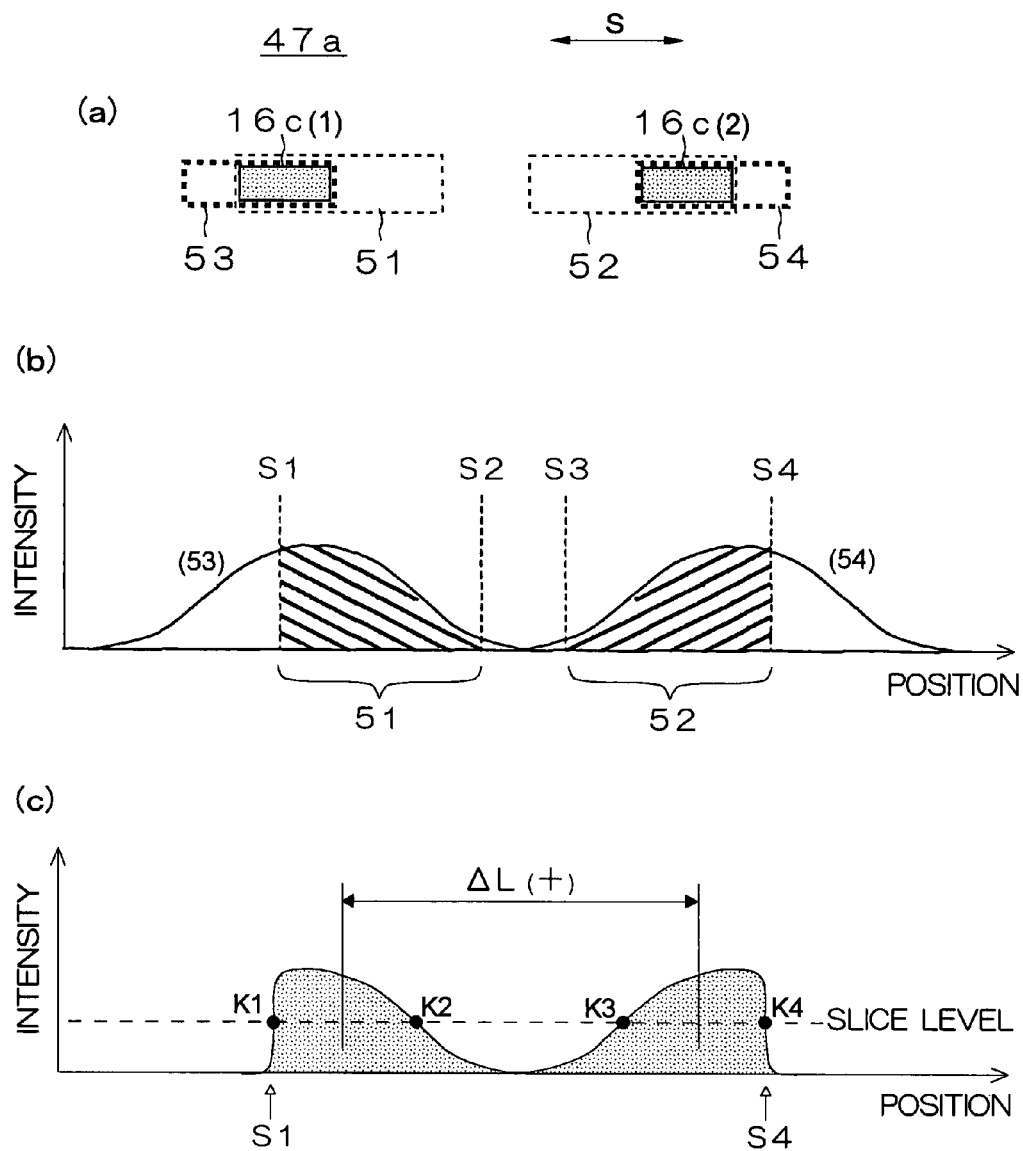
[FIG. 6] are views explaining the final images 16c(1), (2) and the intensity profiles in a rear focus state in which the object plane is situated outside the specified range, and defocused toward an upper side (+ side) from the focused focal plane.
Figure 7:
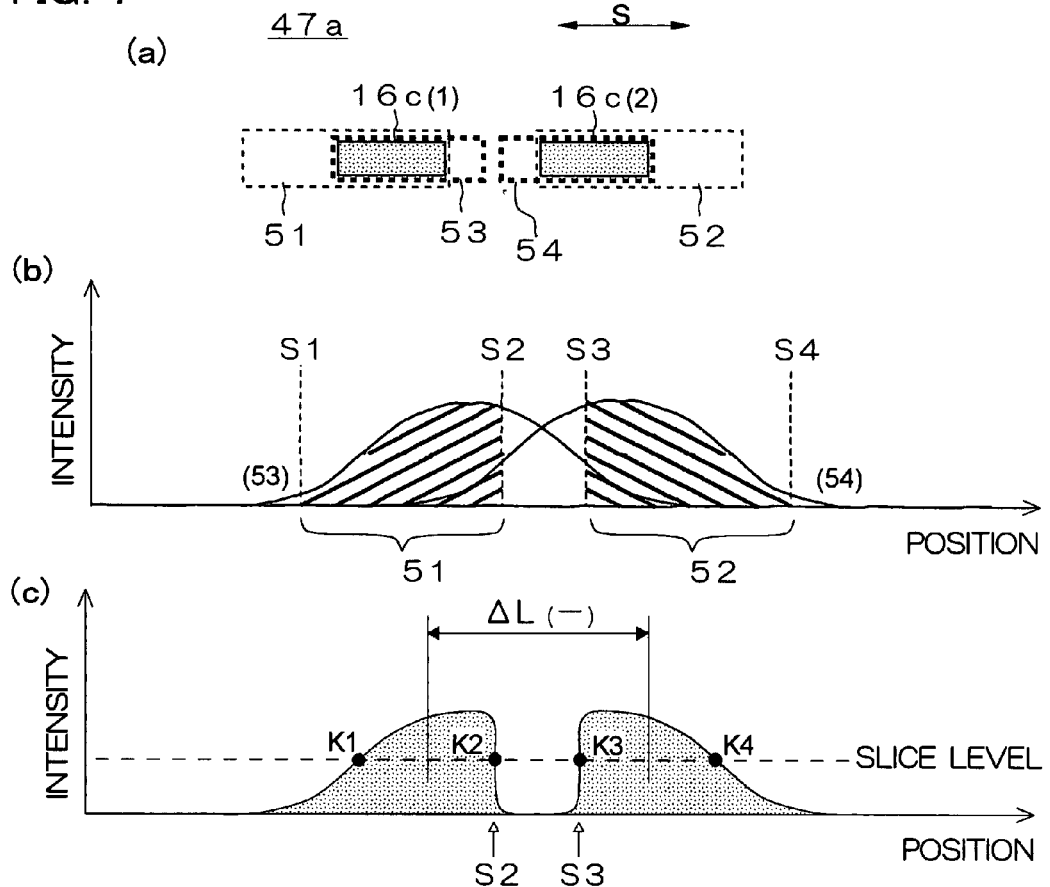
[FIG. 7] are views explaining the final images 16c(1), (2) and the intensity profiles in a front focus state in which the object plane is situated outside the specified range, and defocused toward a lower side (– side) from the focused focal plane.

As stated above, in the focal point detection apparatus of the present embodiment, a portion of the intermediate image 16b of the illumination visual field stop 16 is blocked, and a portion of the remain is transmitted by the AF visual field stop 41, when the object plane is situated outside the specified range containing the focused focal plane, and therefore, it is possible to partially block the final images 16c(1), (2) of the illumination visual field stop 16 by the projection positions of the AF visual field stop 41 (edge positions S1 to S4), on the image pickup plane 47a of the AF sensor 47 (FIG. 6 or FIG. 7).

Consequently, it becomes possible to obtain the four intersection points K1 to K4 with the slice level to generate the focusing signal responsive to the gap ΔL(+) similar to the above, by the intensive profiles containing the blocked portions by the edge positions S1, S4 (FIG. 6(c)) even if the defocus amount toward the + side of the object plane becomes large. Besides, it becomes possible to obtain the four intersection points K1 to K4 with the slice level to generate the focusing signal responsive to the gap ΔL(−) similar to the above, owing to the intensive profiles containing the blocked portions by the edge positions S2, S3 (FIG. 7(c)) even if the defocus amount toward the − side of the object plane becomes large.

Figure 5:
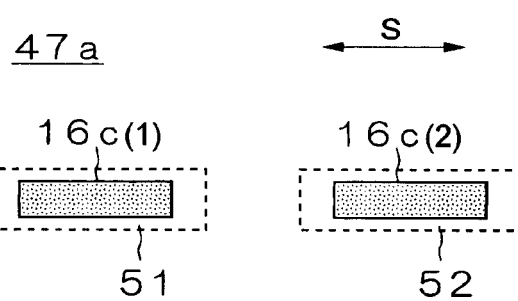
[FIG. 5] are views explaining the final images 16c(1), (2) and intensity profiles when the object plane is situated within a specified range containing a focused focal plane.
Figure 5:
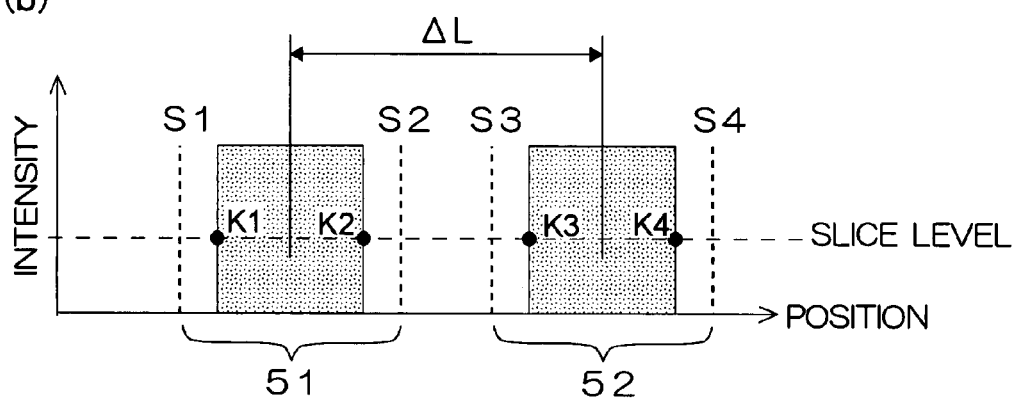

Besides, it becomes possible to pull back the object plane in a direction to approximate the focused focal plane and to drive in the above-stated specified range by using these focusing signal (control signal representing the defocus direction of the object plane). After such a drive-in step, the object plane is situated within the specified range, the intermediate image 16b of the illumination visual field stop 16 transmits without being blocked by the AF visual field stop 41, and therefore, the final images 16c(1), (2) of the illumination visual field stop 16 are not blocked by the projection positions of the AF visual field stop 41 (edge positions S1 to S4) even on the image pickup plane 47a of the AF sensor 47 (FIG. 5).

Consequently, the gap ΔL between the final images 16c(1), (2) in this case increases/decreases linearly in proportion to the change of the locational relationship of the object plane to the focused focal plane. Besides, the focusing signal responsive to the gap ΔL becomes to be the control signal representing the accurate offset (defocus amount) of the object plane. It becomes possible to match the object plane to the focused focal plane (auto-focus operation) by using this focusing signal. At this time, the object plane (surface of the substrate 11) is positioned in the focus state relative to the image pickup plane of the CCD image pickup device 25.

Figure 8:
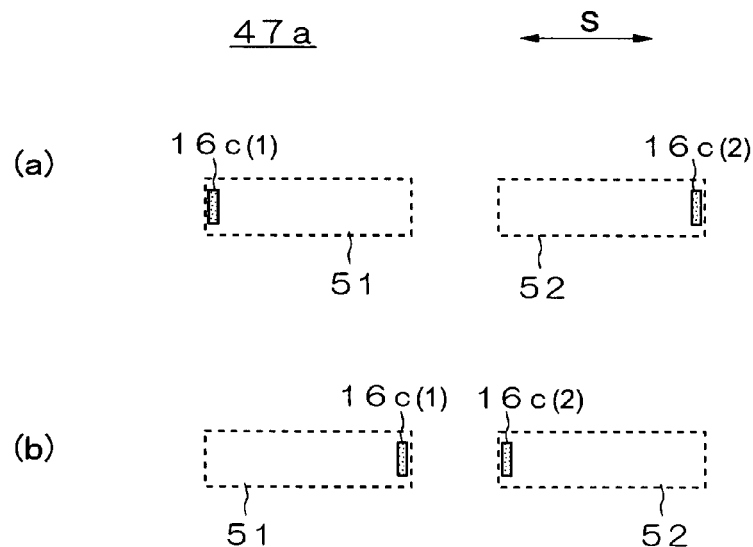
[FIG. 8] are views explaining a pull-in range of an auto-focus operation in the focal point detection apparatus of the present embodiment.

In the focal point detection apparatus of the present embodiment, the pull-in range of the auto-focus operation is from a Z position of the object plane in which the positions of the final images 16c(1), (2) on the image pickup plane 47a of the AF sensor 47 are inside of the projection positions of the AF visual field stop 41 (dotted line frames 51, 52) and most approaching as shown in FIG. 8(a), to the Z position of the object plane which are inside of the projection positions of the AF visual field stop 41 (dotted line frames 51, 52) as shown in FIG. 8(b) and most separating. However, the above-stated pull-in range is the case when the AF sensor 47 secures detectable intensity as the intensity of the final images 16c(1), (2).

According to the focal point detection apparatus of the present embodiment, the pull-in range of the auto-focus operation can be enlarged easily because the AF visual field stop 41 shown in FIG. 2 is provided, and the gap ΔL between the final images 16c(1), (2) (or the gap ΔL(+), or the gap ΔL(−)) is detected inside of the projection positions of the AF visual field 41 (dotted line frames 51, 52) on the image pickup plane 47a of the AF sensor 47.

Concretely speaking, when a numerical aperture NA at the object plane side of the imaging optical system (19 to 23) is set as 0.75, and a size $A_2$ of the AF visual field stop 41 in the measurement direction is set as $1.3 \times A_1$, it is possible to enlarge the pull-in range of the present embodiment to approximately 1.6 times of the conventional one even if a sensor and optical system as same as the conventional ones are used.

Further, in the focal point detection apparatus of the present embodiment, the size $A_2$ of the AF visual field stop 41 in the measurement direction is set so as to satisfy the above-stated equation (1), and therefore, it is possible to surely enlarge the pull-in range of the auto-focus operation even when an adjustment error of the AF visual field stop 41 relative to the optical axis O3 exists.

Besides, in the focal point detection apparatus of the present embodiment, a size $A_4$ of the AF visual field stop 41 in the non-measurement direction is set as $1.3 \times A_3$, and therefore, it is possible to avoid an excessive drop of light intensity of the final images 16c(1), (2) when the defocus amount of the object plane becomes large and the intermediate image 16b of the illumination visual field stop 16 is blurred.

Further, in the focal point detection apparatus of the present embodiment, the pull-in range of the auto-focus operation can be enlarged easily, and therefore, it is possible to address an enlargement of the substrate 11 even if an accuracy of the stage 12 of the overlaying measurement apparatus 10 is not improved. In recent years, the enlargement of the substrate 11 is proceeding (for example, a transition from 200 mm size to 300 mm size in case of a semiconductor wafer) to improve an yield in a manufacturing process of a semiconductor element and so on. Accordingly, there is a possibility that a flatness of the substrate 11 deteriorates caused by the enlargement of the substrate 11. A method is conceivable in which the accuracy of the stage 12 is improved to make the auto-focus operation function normally even in the case as stated above, but it is not preferable because it leads to a cost increase.

The pull-in range of the auto-focus operation can be enlarged easily by using the focal point detection apparatus of the present embodiment, and therefore, it becomes possible to make the auto-focus operation function normally while using the stage 12 having the same accuracy with the conventional one, in a large substrate 11 (for example, the semiconductor wafer with 300 mm size) in which the flatness thereof deteriorates. Consequently, it is possible to avoid an increase of a manufacturing cost of the overlaying measurement apparatus 10 addressable to the enlargement of the substrate 11.

MODIFIED EXAMPLE

Incidentally, in the above-stated embodiment, an example in which the numerical aperture NA at the object plane side of the imaging optical system (19 to 23) is set as 0.75, and the size $A_2$ of the AF visual field stop 41 in the measurement direction is set as $1.3 \times A_1$, is described, but the present invention is not limited to the above. The present invention is applicable for a case when the size $A_2$ is set so as to satisfy the above-stated equation (1) for an arbitrary numerical aperture NA, and an effect similar to the above can be obtained.

Besides, an example in which the illumination visual field stop 16 and the AF visual field stop 41 are conjugate is described in the above-stated embodiment, but the present invention is applicable for a case when the illumination visual field stop 16 and the AF visual field stop 41 are disposed in a vicinity of positions which are conjugate, and the effect similar to the above can be obtained.

Further, in the above-stated embodiment, the slice level is used to obtain the gap $\Delta L$ (or the gap $\Delta L(+)$, or the gap $\Delta L(-)$) between the final images 16c(1), (2), but the present invention is not limited to the above. A light intensity gravity center of the intensity profiles of the final images 16c(1), (2) may be obtained to obtain the gap $\Delta L$ (or the gap $\Delta L(+)$, or the gap $\Delta L(-)$) between the final images 16c(1), (2). However, it is preferable to use the slice level because it can be processed in high speed.

Besides, in the above-stated embodiment, the focal point detection apparatus incorporated in the overlaying measurement apparatus 10 is described as an example, but the present invention is not limited to the above. The present invention is applicable for the focal point detection apparatus incorporated in an apparatus to measure a positional displacement amount of two marks formed on the same layer of the substrate 11, an apparatus to detect an optical positional displacement between a single mark and a reference position of a camera, an apparatus to detect a position of a single mark, and an apparatus to perform an alignment of the substrate 11 before an exposure process for the substrate 11 (namely, an alignment system of an exposure apparatus). In the alignment system, positions of alignment marks formed on a foundation layer are detected, and a locational relationship between the detected result and a stage coordinate system (interferometer, and so on) is obtained.

The invention is not limited to the above embodiments and various modifications may be made without departing from the spirit and scope of the invention. Any improvement may be made in part or all of the components.

What is claimed is:

1. A focal point detection apparatus, comprising:
   an illumination part having an illumination optical system, a condenser lens that condenses light from the illumination optical system, and a first visual field stop of which aperture is formed within a range including an optical axis of the condenser lens, and illuminating an object plane via said first visual field stop;
   a first image-forming part, having a second visual field stop, that forms a single intermediate image of said first visual field stop on a positioning plane of said second visual field stop based on light emitted from said object plane, and transmits said intermediate image without blocking it with the second visual field stop when said object plane is situated within a specified range containing a focused focal plane, and blocks a portion of said intermediate image using said second visual field stop when said object plane is situated outside said specified range, with the remaining portion being transmitted;
   a second image-forming part that divides into two parts the final image of said first visual field stop based on light from said first image-forming part; and
   a generating part that detects a gap between the final images of said first visual field stop that were divided into two and generates a focusing signal responsive to a locational relationship of the object plane to the focused focal plane.

2. The focal point detection apparatus according claim 1, wherein said second visual field stop is conjugate with said first visual field stop and satisfies the following equation with respect to an equivalent direction to said divided-into-two direction on said positioning plane:

$A_1 < A_2 < (1+NA) \times A_1$, in which $A_1$: one-dimensional length of the intermediate image of the first visual field stop when the object plane matches the focused focal plane, $A_2$: one-dimensional length of the second visual field stop, and NA: Numerical aperture of the object plane side of the image-forming part.

* * * * *